(12) United States Patent
Wu

(10) Patent No.: US 11,830,927 B2
(45) Date of Patent: Nov. 28, 2023

(54) METHOD OF MANUFACTURING SEMICONDUCTOR DEVICE

(71) Applicant: TAIWAN SEMICONDUCTOR MANUFACTURING CO., LTD., Hsinchu (TW)

(72) Inventor: Cheng-Hsien Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 17 days.

(21) Appl. No.: 17/574,899

(22) Filed: Jan. 13, 2022

(65) Prior Publication Data

US 2022/0140111 A1 May 5, 2022

Related U.S. Application Data

(62) Division of application No. 16/725,176, filed on Dec. 23, 2019, now Pat. No. 11,264,483, which is a
(Continued)

(51) Int. Cl.
*H01L 29/66* (2006.01)
*H01L 29/165* (2006.01)
(Continued)

(52) U.S. Cl.
CPC ........ *H01L 29/66545* (2013.01); *B82Y 10/00* (2013.01); *H01L 21/027* (2013.01);
(Continued)

(58) Field of Classification Search
CPC ........... H01L 29/66545; H01L 29/0673; H01L 29/0847; H01L 29/165; H01L 29/401; H01L 29/41791; H01L 29/42316; H01L 29/42372; H01L 29/66439; H01L 29/66553; H01L 29/66795; H01L 29/6681; H01L 29/775; H01L 29/78696; H01L 21/02164; H01L 21/0226; H01L 21/02321; H01L 21/027; H01L 21/31116; H01L 21/3115; H01L 21/823431;
(Continued)

(56) References Cited

U.S. PATENT DOCUMENTS 8,796,666 B1 8/2014 Huang et al.
8,815,712 B2 8/2014 Wan et al.
(Continued)

*Primary Examiner* — Dao H Nguyen
(74) *Attorney, Agent, or Firm* — Birch, Stewart, Kolasch & Birch, LLP

(57) ABSTRACT

A method includes: forming a dummy gate dielectric layer over a channel region of a fin structure; forming a dummy gate over the dummy gate dielectric layer; removing the dummy gate and a first portion of the dummy gate dielectric layer to expose the channel region of the fin structure; removing a first nanowire of the fin structure above a second nanowire of the fin structure to remain the second nanowire of the fin structure; forming an interfacial layer surrounding the second nanowire; forming a material layer comprising dopants over the interfacial layer; and performing an annealing process to drive the dopants of the material layer into the interfacial layer, thereby forming a doped interfacial layer surrounding the second nanowire.

20 Claims, 19 Drawing Sheets

Related U.S. Application Data division of application No. 15/866,704, filed on Jan. 10, 2018, now Pat. No. 10,516,032.

(60) Provisional application No. 62/564,333, filed on Sep. 28, 2017.

(51) Int. Cl.

| | |
|---|---|
| *H01L 21/02* | (2006.01) |
| *H01L 29/423* | (2006.01) |
| *H01L 29/78* | (2006.01) |
| *H01L 21/311* | (2006.01) |
| *H01L 21/027* | (2006.01) |
| *H01L 29/06* | (2006.01) |
| *B82Y 10/00* | (2011.01) |
| *H01L 21/3115* | (2006.01) |
| *H01L 29/786* | (2006.01) |
| *H01L 29/775* | (2006.01) |
| *H01L 29/08* | (2006.01) |
| *H01L 29/40* | (2006.01) |
| *H01L 21/8234* | (2006.01) |
| *H01L 21/8238* | (2006.01) |
| *H01L 21/84* | (2006.01) |
| *H01L 27/088* | (2006.01) |
| *H01L 27/092* | (2006.01) |
| *H01L 27/12* | (2006.01) |
| *H01L 29/417* | (2006.01) |

(52) U.S. Cl.
CPC .... *H01L 21/0226* (2013.01); *H01L 21/02164* (2013.01); *H01L 21/02321* (2013.01); *H01L 21/3115* (2013.01); *H01L 21/31116* (2013.01); *H01L 21/823431* (2013.01); *H01L 21/823821* (2013.01); *H01L 21/845* (2013.01); *H01L 27/0886* (2013.01); *H01L 27/0924* (2013.01); *H01L 27/1211* (2013.01); *H01L 29/0673* (2013.01); *H01L 29/0847* (2013.01); *H01L 29/165* (2013.01); *H01L 29/401* (2013.01); *H01L 29/41791* (2013.01); *H01L 29/42316* (2013.01); *H01L 29/42372* (2013.01); *H01L 29/42392* (2013.01); *H01L 29/6681* (2013.01); *H01L 29/66439* (2013.01); *H01L 29/66553* (2013.01); *H01L 29/66795* (2013.01); *H01L 29/775* (2013.01); *H01L 29/785* (2013.01); *H01L 29/78696* (2013.01)

(58) Field of Classification Search
CPC ........... H01L 21/823821; H01L 21/845; H01L 27/0886; H01L 27/0924; H01L 27/1211
See application file for complete search history.

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 8,963,258 | B2 | 2/2015 | Yu et al. |
| 9,093,514 | B2 | 7/2015 | Tsai et al. |
| 9,093,530 | B2 | 7/2015 | Huang et al. |
| 9,171,929 | B2 | 10/2015 | Lee et al. |
| 9,209,247 | B2 | 12/2015 | Colinge et al. |
| 9,214,555 | B2 | 12/2015 | Oxland et al. |
| 9,236,267 | B2 | 1/2016 | De et al. |
| 9,245,805 | B2 | 1/2016 | Yeh et al. |
| 9,412,817 | B2 | 8/2016 | Yang |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,548,303 | B2 | 1/2017 | Lee et al. |
| 9,570,551 | B1 | 2/2017 | Balakrishnan et al. |
| 9,576,814 | B2 | 2/2017 | Wu et al. |
| 9,590,038 | B1* | 3/2017 | Kim ................ H01L 29/78696 |
| 9,608,116 | B2 | 3/2017 | Ching et al. |
| 10,134,843 | B2* | 11/2018 | Chen ................ H01L 29/78696 |
| 2012/0001266 | A1 | 1/2012 | Lim et al. |
| 2012/0326245 | A1* | 12/2012 | Ando ................ H01L 21/28176 257/411 |
| 2014/0001520 | A1* | 1/2014 | Glass ................ H01L 29/167 257/E21.409 |
| 2016/0020264 | A1 | 1/2016 | Choo et al. |
| 2017/0194213 | A1 | 7/2017 | Ching et al. |
| 2017/0207218 | A1 | 7/2017 | Chang et al. |
| 2017/0271477 | A1 | 9/2017 | Palle et al. |
| 2018/0151745 | A1 | 5/2018 | Chang et al. |
| 2018/0175175 | A1 | 6/2018 | Yeong et al. |
| 2018/0248015 | A1* | 8/2018 | Glass ................ H01L 29/0649 |
| 2018/0269306 | A1 | 9/2018 | Bao et al. |
| 2018/0323309 | A1 | 11/2018 | Ando et al. |
| 2018/0331215 | A1 | 11/2018 | Balakrishnan et al. |

* cited by examiner

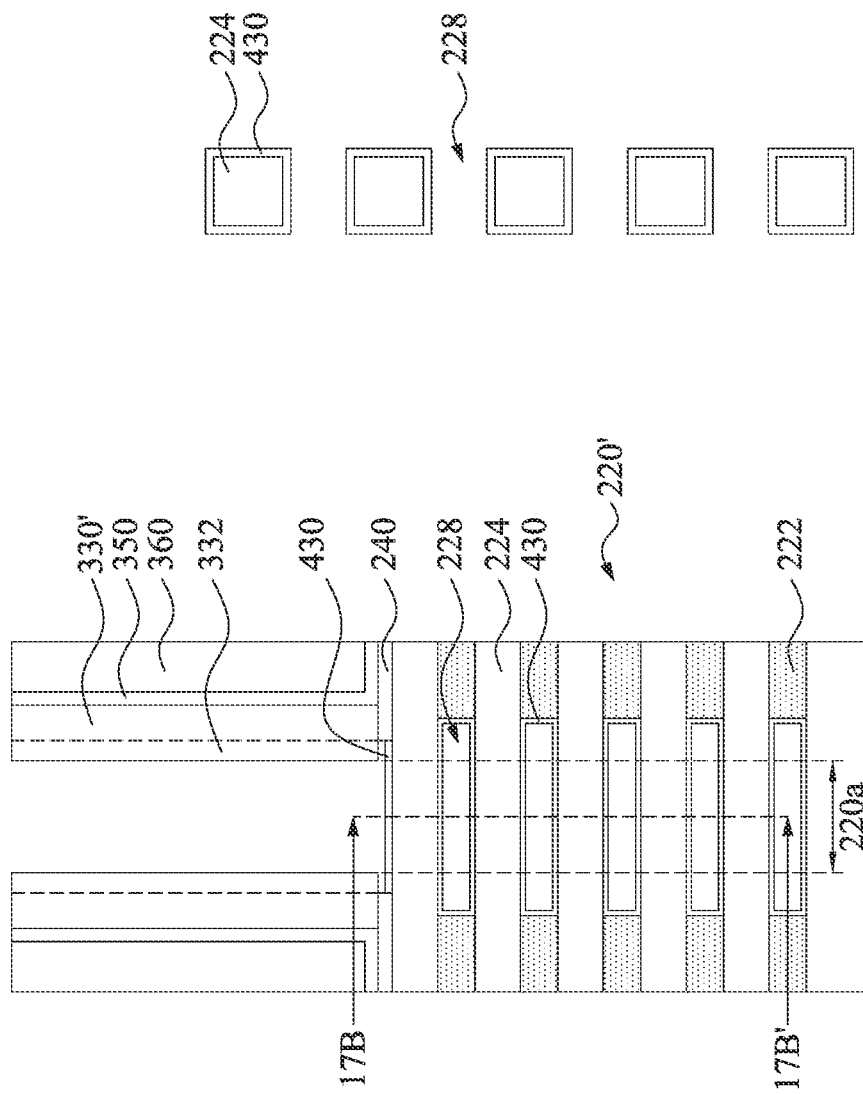

METHOD OF MANUFACTURING SEMICONDUCTOR DEVICE

RELATED APPLICATIONS

The present application is a Divisional Application of the U.S. application Ser. No. 16/725,176, filed Dec. 23, 2019, which is a Divisional Application of the U.S. application Ser. No. 15/866,704, filed Jan. 10, 2018, now U.S. Pat. No. 10,516,032, issued on Dec. 24, 2019, which claims priority to U.S. Provisional Application Ser. No. 62/564,333, filed Sep. 28, 2017, which are herein incorporated by reference in their entirety.

BACKGROUND

The semiconductor integrated circuit (IC) industry has experienced rapid growth. Over the course of the growth, functional density of the semiconductor devices has increased with decrease of device feature size or geometry. The scaling down process generally provides benefits by increasing production efficiency, reducing costs, and/or improving device performance.

With the demands on shrinking geometry of ICs, a three dimensional transistor, such as a fin-like field-effect transistor (FinFET), has been introduced to replace a planar transistor. However, device performance of such FinFET is still not satisfactory in advanced applications of technology. Therefore, improvements in structures and methods of manufacturing a semiconductor device with better device performance continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16A, 17A and 18A are cross-sectional views at various stages of manufacturing a semiconductor device subsequent to FIG. 15B in accordance with some embodiments of the present disclosure;

FIG. 16B is a cross-sectional view of the semiconductor device taken along a section line 16B-16B' of FIG. 16A in accordance with some embodiments of the present disclosure;

FIG. 17B is a cross-sectional view of the semiconductor device taken along a section line 17B-17B' of FIG. 17A in accordance with some embodiments of the present disclosure;

DETAILED DESCRIPTION

Figure 1:
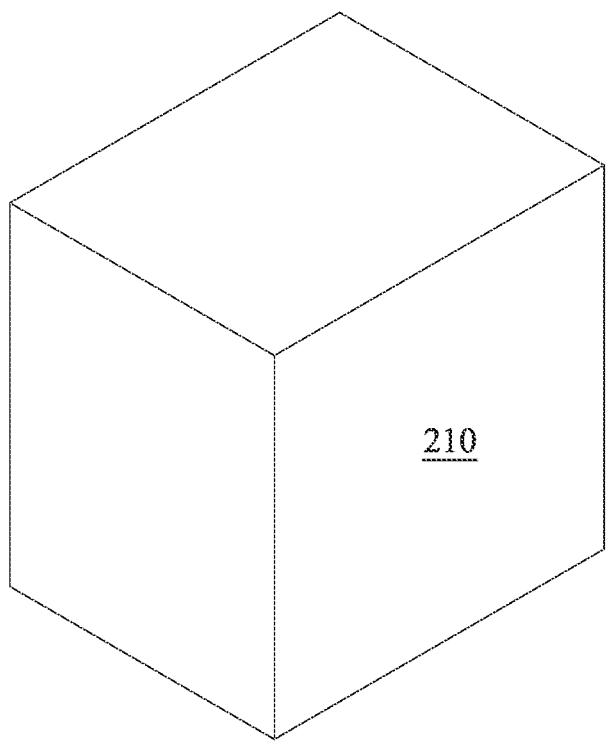
FIGS. 1-11 are perspective views at various stages of manufacturing a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As mentioned above, device performance of a fin-like field-effect transistor (FinFET), such as capacitance of gate oxide ($C_{ox}$) and $I_{on}$, is still not satisfactory in advanced applications of technology. Therefore, the present disclosure provides a method of forming a semiconductor device including a doped interfacial layer with high k-value to increase $C_{ox}$ and $I_{on}$ of the semiconductor device.

FIGS. 1-11 are perspective views at various stages of manufacturing a semiconductor device in accordance with some embodiments of the present disclosure. As shown in FIG. 1, a substrate 210 is received. The term "substrate" as used herein refers to a bulk substrate that serves as a basis. In some embodiments, the substrate 210 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the substrate 210 is a bulk silicon substrate. In some embodiments, the substrate 210 optionally includes an epitaxial layer, a silicon-on-insulator (SOI) structure and/or other suitable performance enhancement features.

Figure 2:
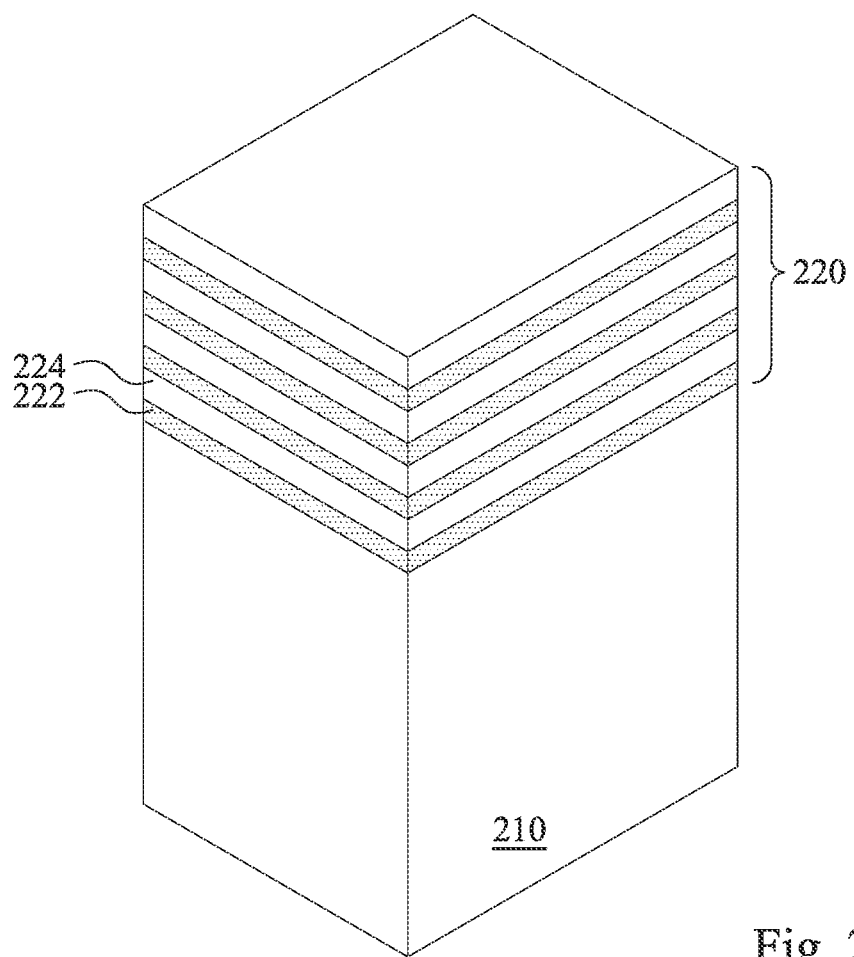

As shown in FIGS. 1 and 2, an epitaxial stack 220 is formed over the substrate 210. The epitaxial stack 220 includes first epitaxial layers 222 of a first composition and second epitaxial layers 224 of a second composition alternately disposed with the first epitaxial layers 222. The first and second compositions may be different or may be the same. In some embodiments, the first epitaxial layers 222 are made of SiGe, and the second epitaxial layers 224 are made of silicon, but not limited thereto. In some embodiments, a top-most epitaxial layer of the epitaxial stack 220 is the second epitaxial layer 224.

There are four layers of each of the first epitaxial layers 222 and the second epitaxial layers 224 illustrated in FIG. 2, and this is for illustrative purposes only and not intended to be limiting. It can be appreciated that any number of the first or second epitaxial layers can be formed in the epitaxial stack 220, and the number of the first and the second epitaxial layers depends on the desired number of channels regions for the semiconductor device.

Figure 3:
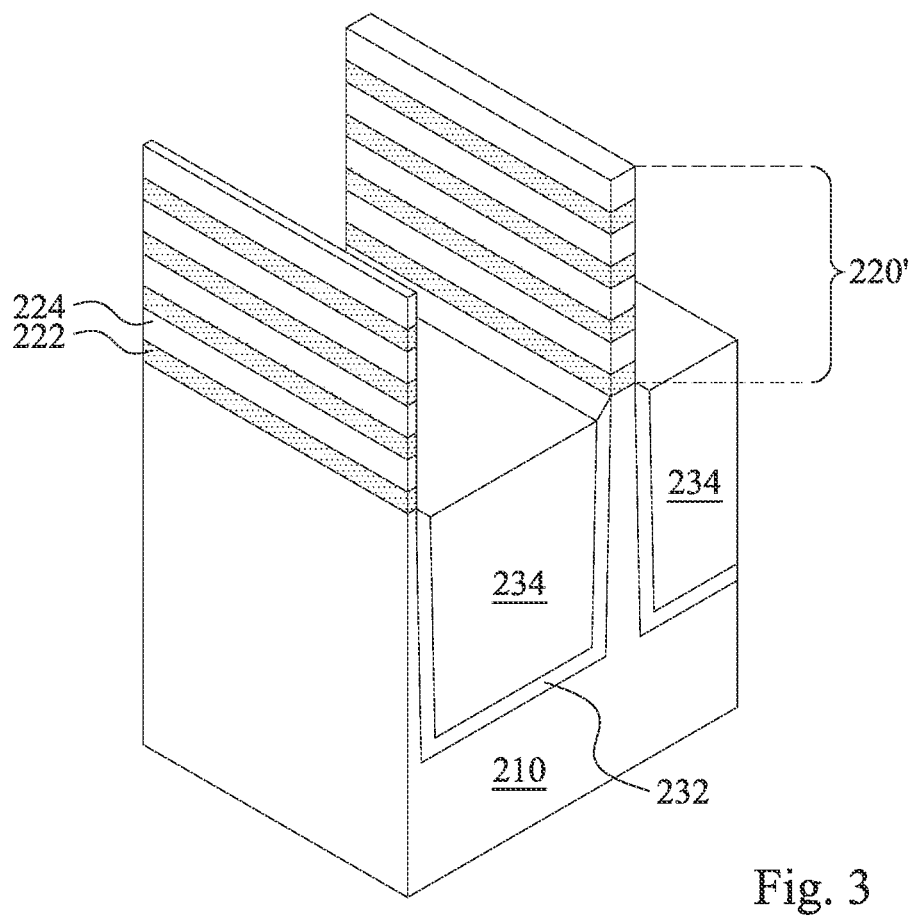

As shown in FIGS. 2 and 3, the epitaxial stack 220 and the substrate 210 are patterned to form trenches in the epitaxial stack 220 and the substrate 210. In some embodiments, a hard mask layer (not shown) is formed over the epitaxial stack 220 of FIG. 2, and a photolithography and etch process is then performed to form the trenches in the epitaxial stack 220 and the substrate 210.

Still referring to FIGS. 2 and 3, shallow trench isolation (STI) features 234 are formed in the trenches. By way of example, in some embodiments, the trenches are filled with a dielectric material, and then planarized and recessed to form the STI features 234 and to provide fin structures 220' extending above the STI features 234. In some embodiments, the dielectric material includes silicon oxide, silicon nitride, silicon oxynitride, fluorine-doped silicate glass (FSG), a low-k dielectric material, combinations thereof, and/or other suitable materials. In some embodiments, the dielectric material is deposited by a chemical vapor deposition (CVD) process, a subatmospheric CVD (SACVD) process, a flowable CVD process, an atomic layer deposition (ALD) process, a physical vapor deposition (PVD) process, and/or other suitable processes.

Referring to FIG. 3, prior to forming the STI features 234, a dielectric layer 232 is formed in the trenches. In some embodiments, the dielectric layer 232 includes silicon nitride, silicon carbide, and/or other proper material. In some embodiments, the dielectric layer 232 is formed by CVD, ALD, PVD, and/or other suitable processes.

However, numerous other embodiments of methods to form the fin structures 220' on the substrate 210 may also be used including, for example, defining the fin region (e.g., by mask or isolation regions) and epitaxially growing the first and second epitaxial layers 222, 224 to form the fin structure 220'.

Figure 4:
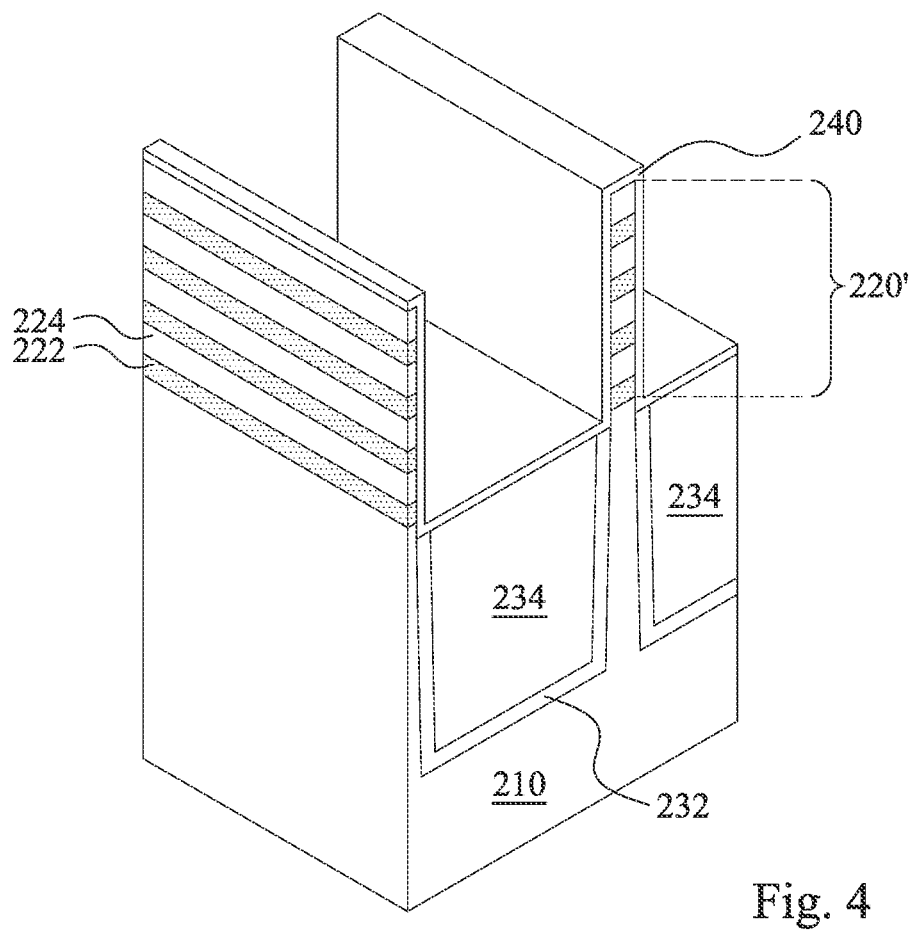

As shown in FIGS. 3 and 4, a dummy dielectric layer 240 is formed over the fin structure 220'. In some embodiments, the dummy dielectric layer 240 includes silicon oxide, silicon nitride, a high-k dielectric material and/or other suitable material. In various examples, the dummy dielectric layer 240 may be deposited by a CVD process, a subatmospheric CVD (SACVD) process, a flowable CVD process, an ALD process, a PVD process, or other suitable processes. By way of example, the dummy dielectric layer 240 may be used to prevent damage to the fin structures 220' by subsequent processes (e.g., subsequent formation of the dummy gate stack).

Figure 5:
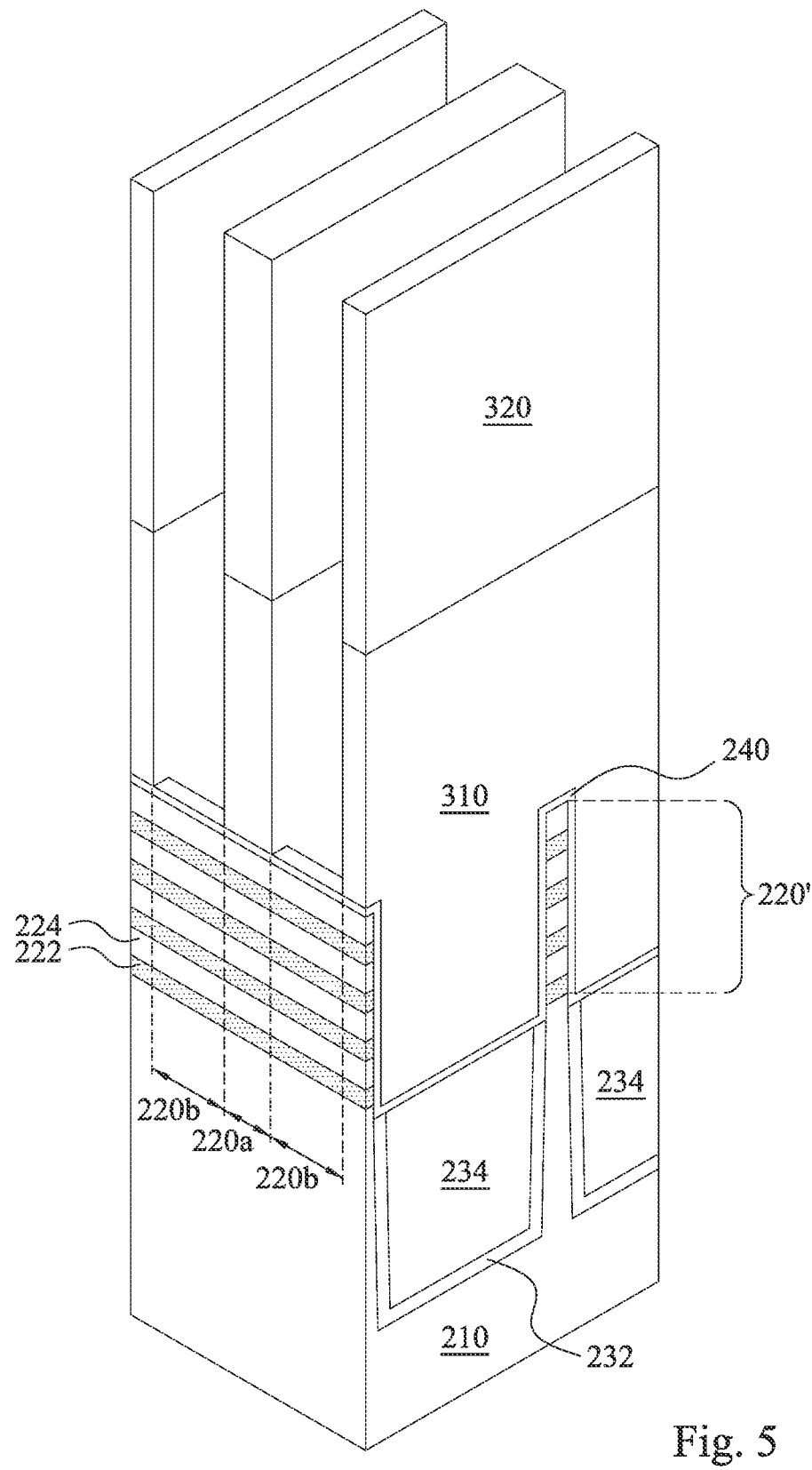

As shown in FIGS. 4 and 5, a dummy gate 310 is formed across the fin structures 220'. In some embodiments, the dummy gate 310 is formed over the substrate 210 and at least partially disposed over the fin structure 220'. The dummy gate 310 is formed to define a channel region 220a and source/drain regions 220b of the fin structure 220'. In particular, the dummy gate 310 may be replaced at a later processing stage by a gate structure as described below. In some embodiments, a hard mask 320 is formed over the dummy gate 310. In some embodiments, the hard mask 320 may include silicon nitride, silicon oxide, silicon oxynitride or a combination thereof.

In some embodiments, the dummy gate 310 is made of polysilicon, amorphous silicon, any other suitable material or a combination thereof. In some embodiments, the dummy gate 310 is fabricated by layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. Exemplary patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. Exemplary etching process may include dry etching (e.g., RIE etching), wet etching, and/or other etching methods.

Figure 6:
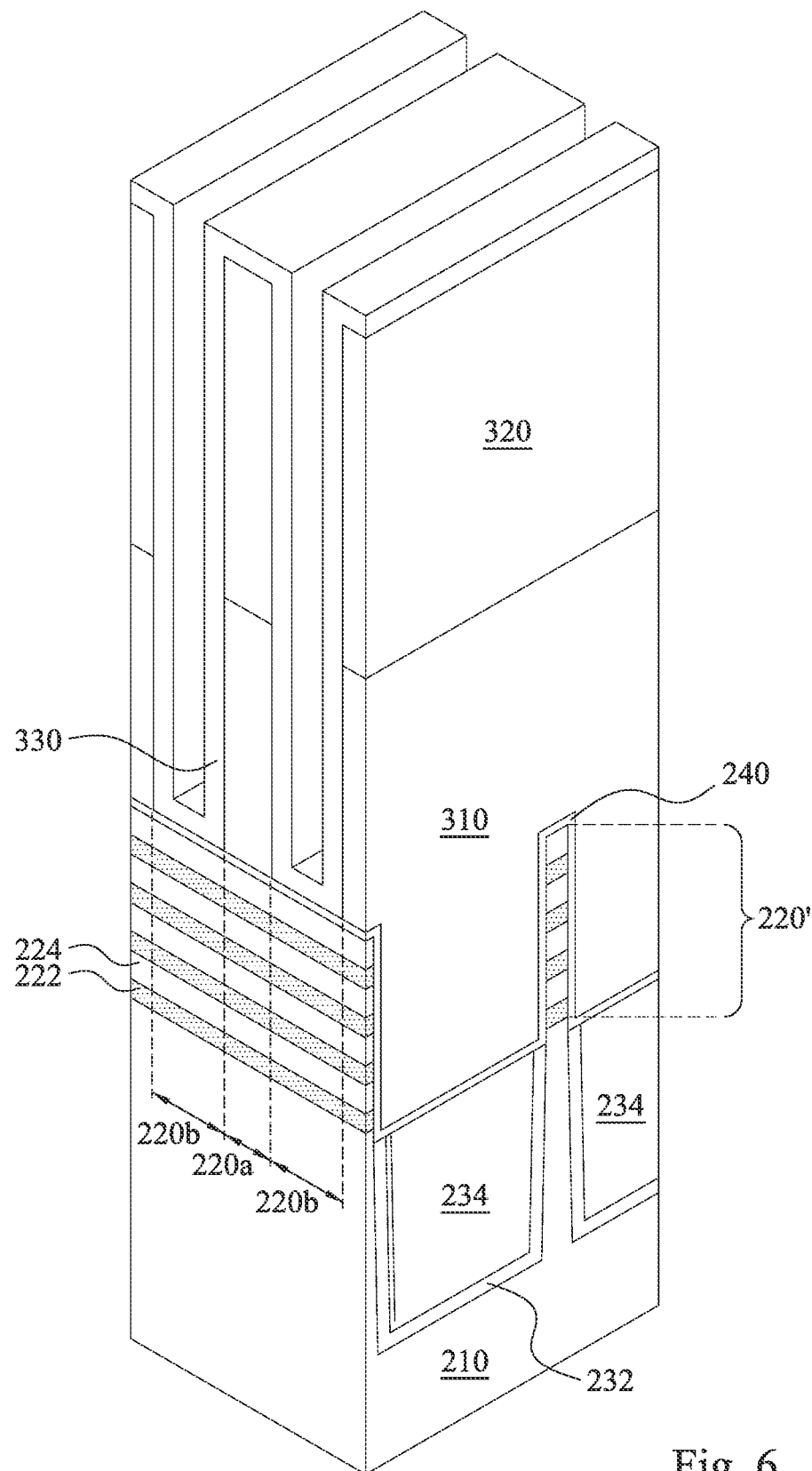

As shown in FIGS. 5 and 6, a spacer layer 330 is formed over the dummy gate 310, the hard mask 320, the fin structure 220' and the substrate 210. The spacer layer 330 may be a conformal dielectric layer formed over the substrate 210, including over portions of the fin structure 220'. The spacer layer 330 may form spacer elements on sidewalls of the dummy gate 310 and the hard mask 320. In some embodiments, the spacer layer 330 includes a dielectric material such as silicon oxide, silicon nitride, silicon carbide, silicon oxynitride, SiCN films, silicon oxycarbide (SiOCN) films, and/or combinations thereof. In some embodiments, the spacer layer 330 includes multiple layers, such as main spacer walls, liner layers, and the like. By way of example, the spacer layer 330 may be formed by depositing a dielectric material over the dummy gate 310, the hard mask 320, the fin structure 220' and the substrate 210 using processes such as, CVD process, a subatmospheric CVD (SACVD) process, a flowable CVD process, an ALD process, a PVD process, or other suitable process. In certain embodiments, the deposition may be followed by an etching back the dielectric material.

Figure 7:
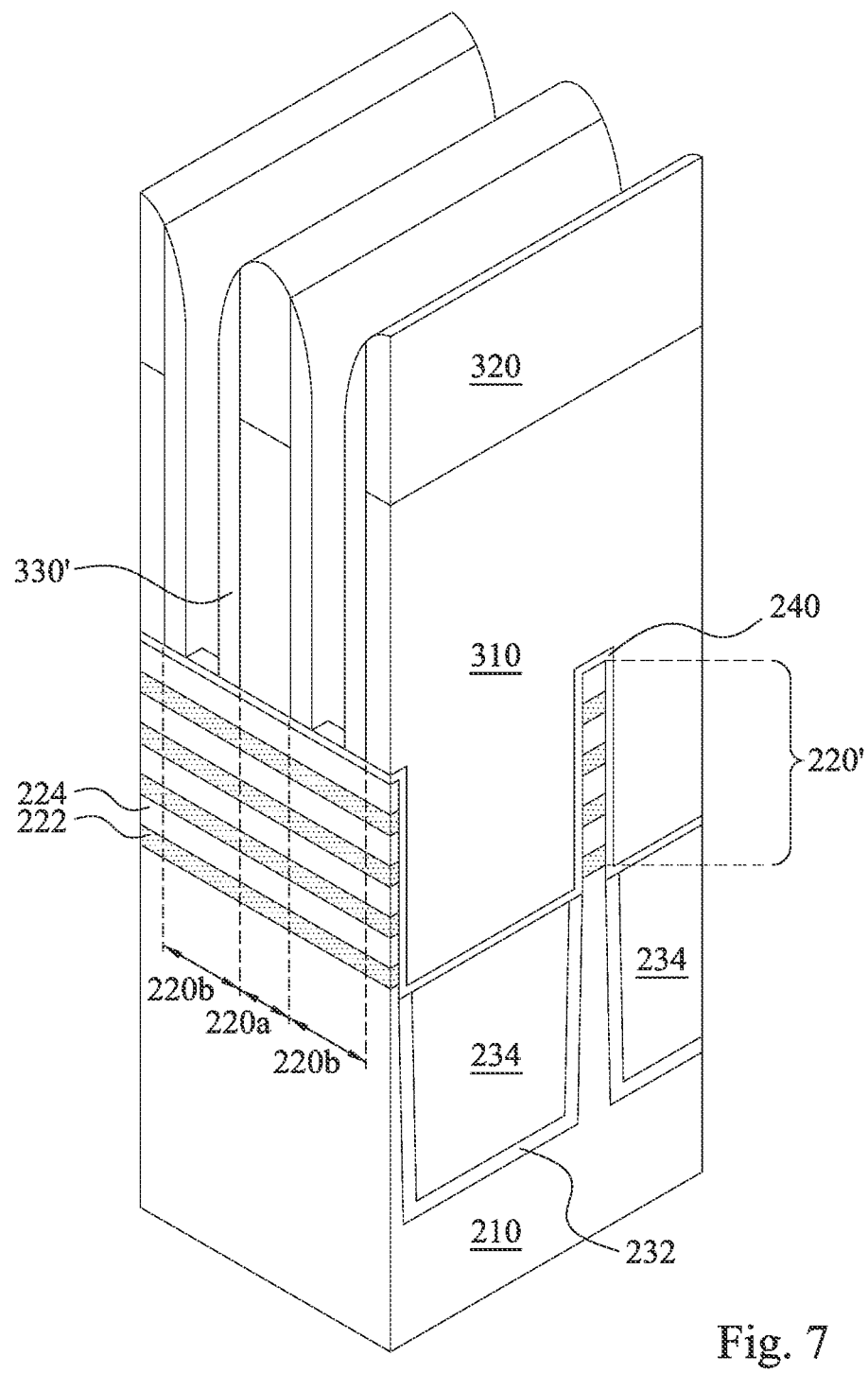

As shown in FIGS. 6 and 7, the spacer layer 330 is etched back (e.g., anisotropically) to remain the spacer 330' on sidewalls of the dummy gate 310 and the hard mask 320. The spacer 330' is adjacent to both sides of the dummy gate 310 and both sides of the hard mask 320. In some embodiments, the spacer layer 330 is etched back to expose portions of the fin structures 220' and the dummy dielectric layer 240 thereover. In some embodiments, etching-back of the spacer layer 330 may include a wet etch process, a dry etch process, a multiple-step etch process, and/or a combination thereof.

Figure 8:
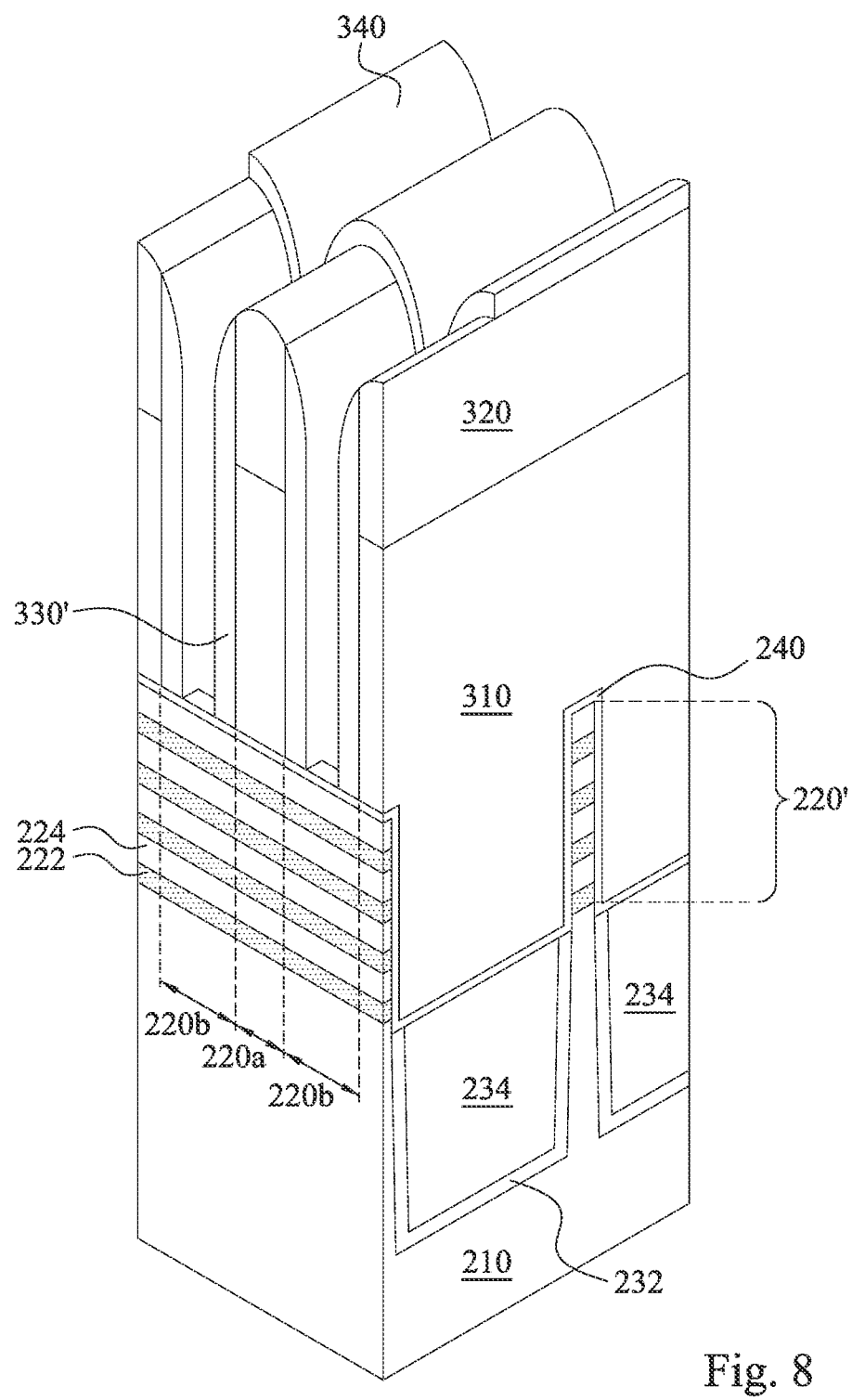

As shown in FIGS. 7 and 8, another hard mask 340 is formed over one of the fin structures 220', and the dummy dielectric layer 240, the dummy gate 310, the hard mask 320 and the spacer 330' thereover. In some embodiments, the hard mask 340 includes silicon nitride, silicon oxide, silicon oxynitride or a combination thereof. In some embodiments, the hard mask 340 is formed by CVD, ALD and/or other suitable technique.

Figure 9:
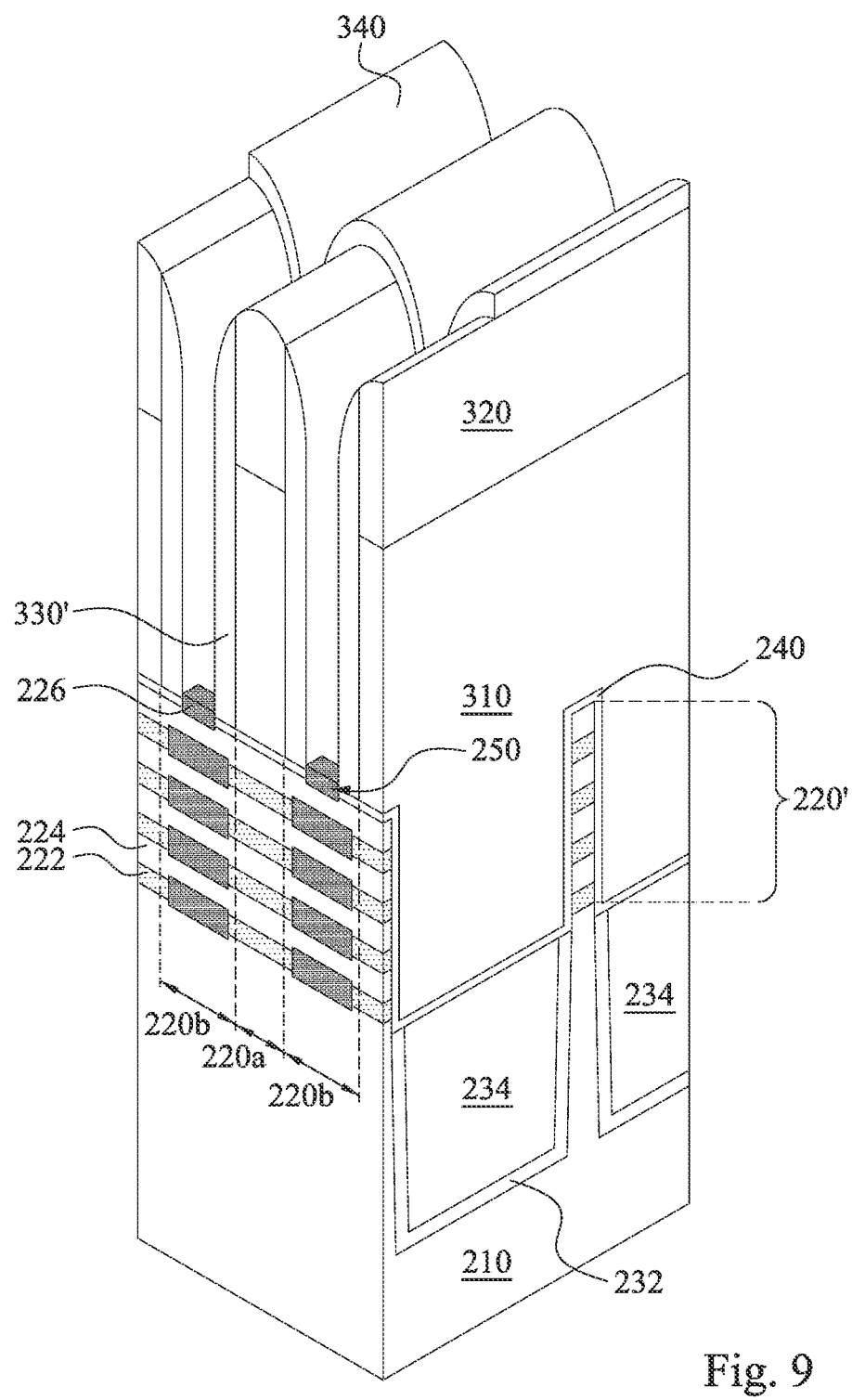

As shown in FIGS. 8 and 9, after the hard mask 340 is formed, the dummy dielectric layer 240 over another fin structure 220' is removed to expose the source/drain regions 220b of the fin structure 220'. In some embodiments, the dummy dielectric layer 240 is removed using a selective etch process such as a selective wet etch, a selective dry etch, or a combination thereof.

Still referring to FIGS. 8 and 9, after the dummy dielectric layer 240 over the other fin structure 220' is removed, source/drain features 250 are formed in the source/drain regions 220b. In some embodiments, the first epitaxial layers 222 in the source/drain regions 220b are removed to form openings (not shown), and a third epitaxial material 226 of a third composition is then formed in those openings and covering the fin structure 220' in the source/drain regions 220b, thereby forming the source/drain features 250. In some embodiments, the first epitaxial layers 222 in the source/drain regions 220b are removed by a selective etch process, such as a selective wet etch, a selective dry etch, or a combination thereof. In some embodiments, the third epitaxial material 226 includes Ge, Si, GaAs, AlGaAs, SiGe, GaAsP, SiP, and/or other suitable material. In some embodiments, the third epitaxial material 226 is doped (e.g., in-situ doped) during an epi process. In some embodiments, the third epitaxial material 226 is doped with boron or phosphorus. In some embodiments, the third epitaxial material 226 is doped with phosphorus to form SiP. In some embodiments, the third epitaxial material 226 is doped with boron to form boron-doped SiGe. In some embodiments, the source/drain features 250 are also called as all-around cladding source/drain features.

In other embodiments, the source/drain features are formed by forming an epitaxial layer (not shown) covering the exposed fin structure 220' in the source/drain regions 220b without removing the first epitaxial layers 222 in the source/drain regions 220b. In some embodiments, the epitaxial layer includes Ge, Si, GaAs, AlGaAs, SiGe, GaAsP, SiP, and/or other suitable material. In some embodiments, the epitaxial layer is doped (e.g., in-situ doped) during an epi process. In some embodiments, the epitaxial layer is doped with boron or phosphorus. In some embodiments, the epitaxial layer is doped with phosphorus to form SiP. In some embodiments, the epitaxial layer is doped with boron to form boron-doped SiGe.

Figure 10:
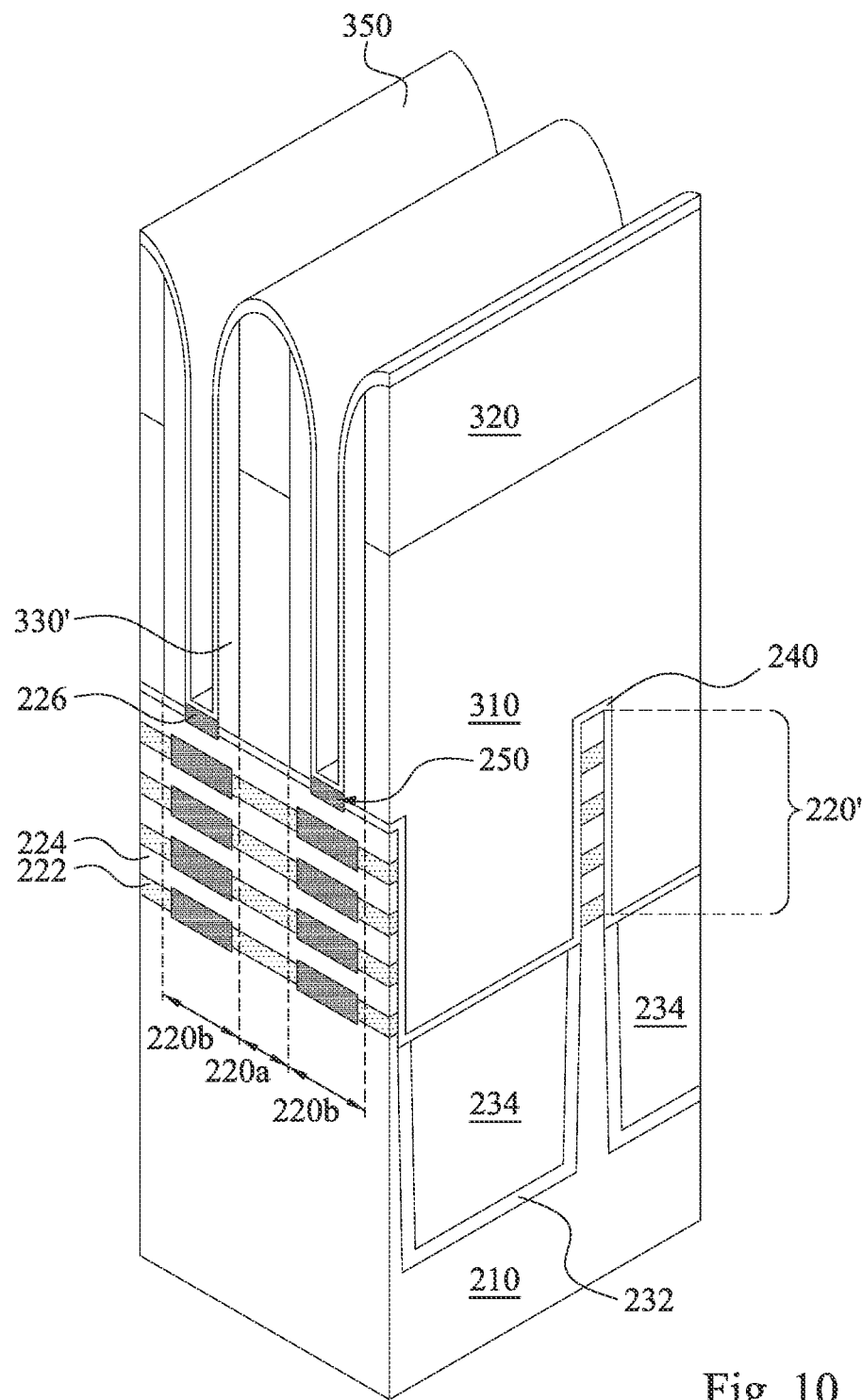

As shown in FIGS. 9 and 10, the hard mask 340 is removed, and a contact etch stop layer (CESL) 350 is then formed. In some embodiments, the CESL 350 is a conformal dielectric layer. In some embodiments, the CESL 350 includes a silicon nitride layer, silicon oxide layer, a silicon oxynitride layer, and/or other materials known in the art. In some embodiments, the CESL 350 is formed using sputtering, PVD, CVD, MOCVD (metal organic chemical vapor deposition) or MBE (molecular beam epitaxy), and/or other suitable deposition or oxidation processes.

Figure 11:
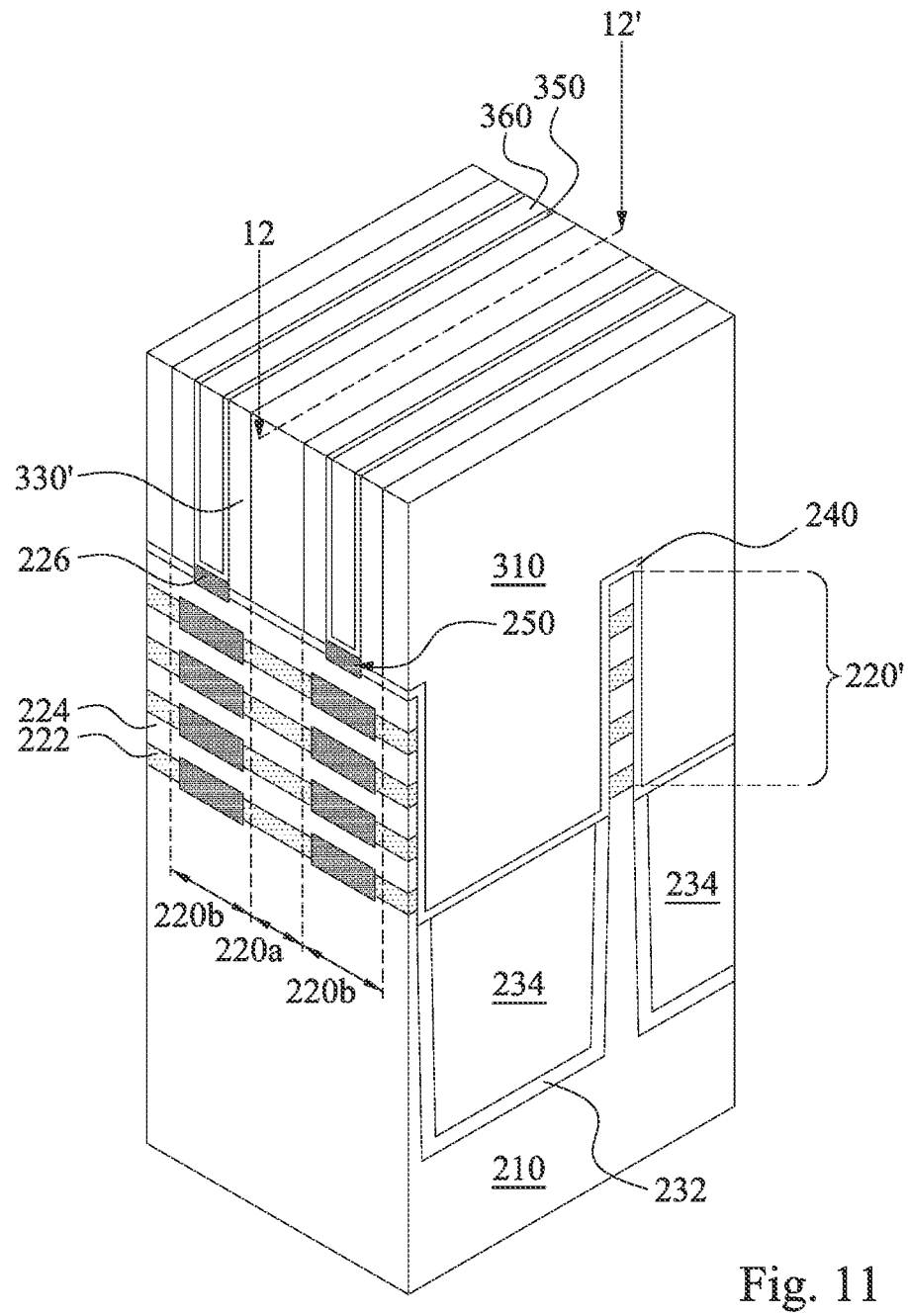

As shown in FIGS. 10 and 11, after the CESL 350 is formed, an inter-layer dielectric (ILD) layer 360 is formed over the source/drain regions 220b of the fin structure 220'. In some embodiments, the ILD layer 360 includes a dielectric material such as silicon oxide, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the ILD layer 360 is formed using sputtering, PVD, CVD, MOCVD, MBE, other methods known and used in the art for forming the ILD layer 360 or a combination thereof.

As shown in FIG. 11, after the ILD layer 360 is formed, a planarization process is performed to expose a top surface of the dummy gate 310. In some embodiments, the planarization process includes a chemical mechanical polish (CMP) process, a grinding process, an etching process, any other suitable material removal process or a combination thereof. In some embodiments, the planarization process removes the hard mask 320 over the dummy gate 310.

Figure 12:
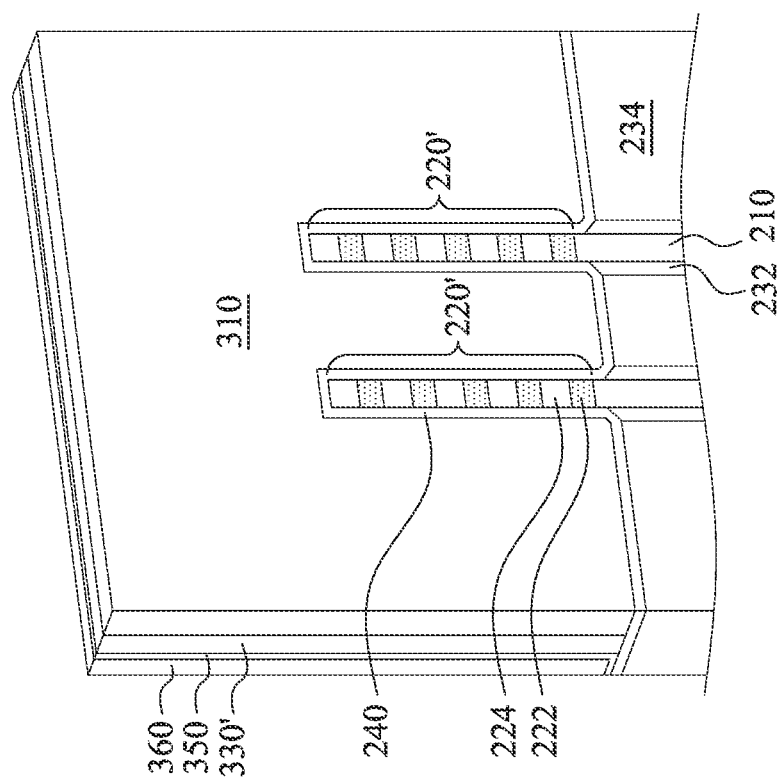
FIG. 12 is a cross-sectional view of the semiconductor device taken along a section line 12-12' of FIG. 11 in accordance with some embodiments of the present disclosure.
Figure 13:
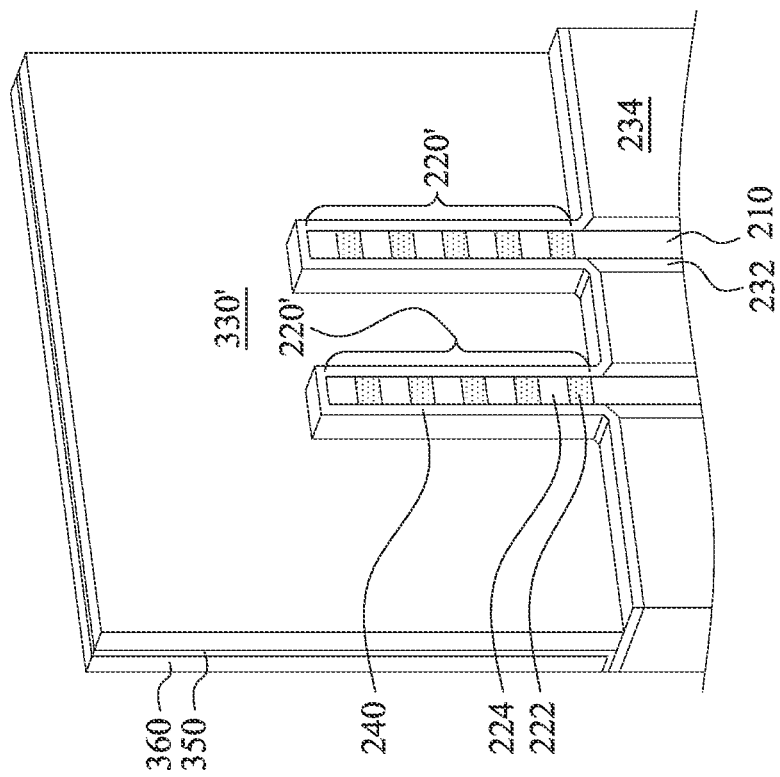
FIGS. 13, 14A and 15A are cross-sectional views at various stages of manufacturing a semiconductor device subsequent to FIG. 12 in accordance with some embodiments of the present disclosure.

FIG. 12 is a cross-sectional view of the semiconductor device taken along a section line 12-12' of FIG. 11 in accordance with some embodiments of the present disclosure. FIGS. 13, 14A and 15A are cross-sectional views at various stages of manufacturing a semiconductor device subsequent to FIG. 12 in accordance with some embodiments of the present disclosure.

As shown in FIG. 12, a semiconductor structure includes the fin structure 220', the dummy gate 310 and the dummy dielectric layer 240. The dummy gate 310 is across over the fin structure 220' to define the channel region of the fin structure 220'. The dummy dielectric layer 240 separates the channel region of the fin structure 220' from the dummy gate 310.

As shown in FIGS. 12 and 13, the dummy gate 310 is removed to expose the dummy dielectric layer 240. The channel region of the fin structure 220' is beneath the exposed dummy dielectric layer 240. In some embodiments, the removal of the dummy gate 310 may be performed using a selective etch process such as a selective wet etch, a selective dry etch, or a combination thereof.

As shown in FIGS. 13 and 14A, the exposed dummy dielectric layer 240 is removed to expose the channel region of the fin structure 220'. In some embodiments, the dummy dielectric layer 240 is removed using a selective etch process such as a selective wet etch, a selective dry etch, or a combination thereof.

Figure 14B:
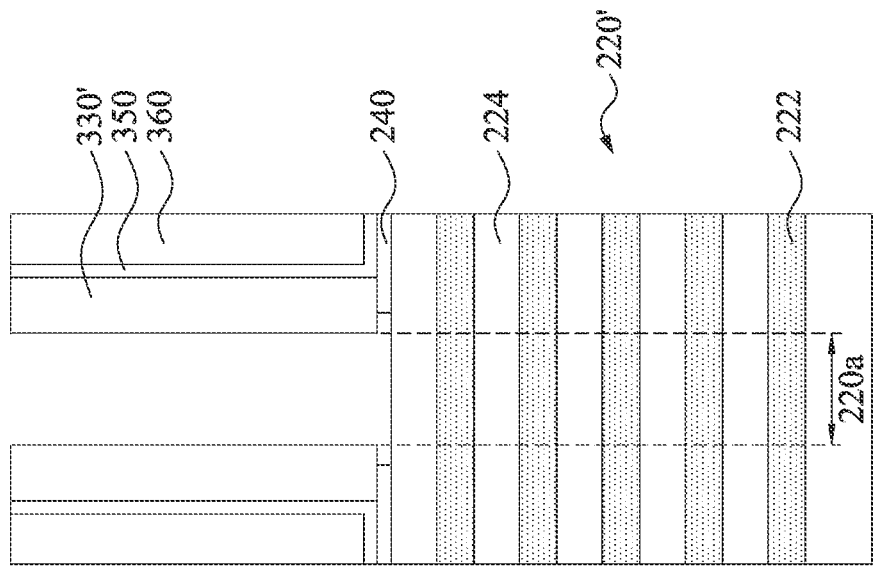
FIG. 14B is a cross-sectional view of the semiconductor device taken along a section line 14B-14B' of FIG. 14A in accordance with some embodiments of the present disclosure.
Figure 14A:
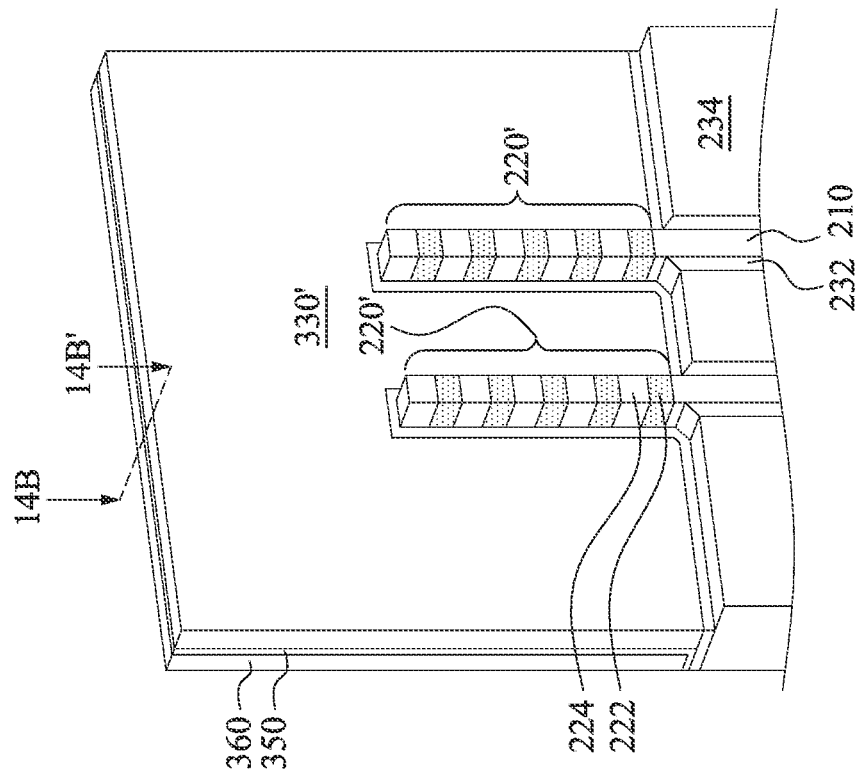

FIG. 14B is a cross-sectional view of the semiconductor device taken along a section line 14B-14B' of FIG. 14A in accordance with some embodiments of the present disclosure. As shown in FIGS. 14A and 14B, the exposed dummy dielectric layer 240 is removed to expose the channel region 220a the fin structure 220'. The channel region 220a of the fin structure 220' includes first nanowires (i.e., first epitaxial layers) 222 of the first composition and second nanowire (i.e., second epitaxial layers) 224 of the second composition alternately disposed with the first nanowires 222.

As shown in FIGS. 14A and 15A, in the channel region of the fin structure 220', the first nanowires 222 are removed from one of the fin structures 220' to form a plurality of openings 228 and to remain the second nanowires 224. In some embodiments, the first nanowires 222 are removed by a selective etch process such as a selective wet etch, a selective dry etch, or a combination thereof.

Figure 15B:
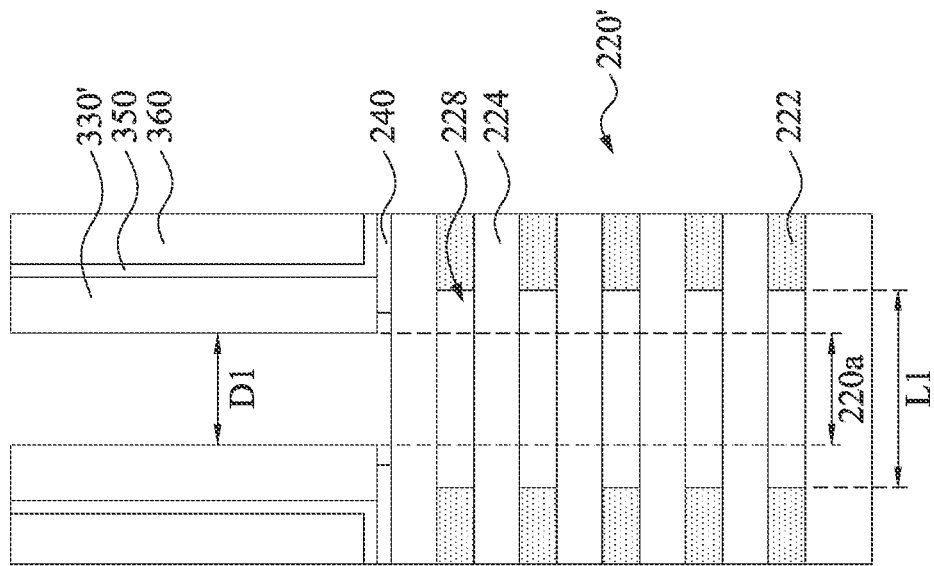
FIG. 15B is a cross-sectional view of the semiconductor device taken along a section line 15B-15B' of FIG. 15A in accordance with some embodiments of the present disclosure.
Figure 15A:
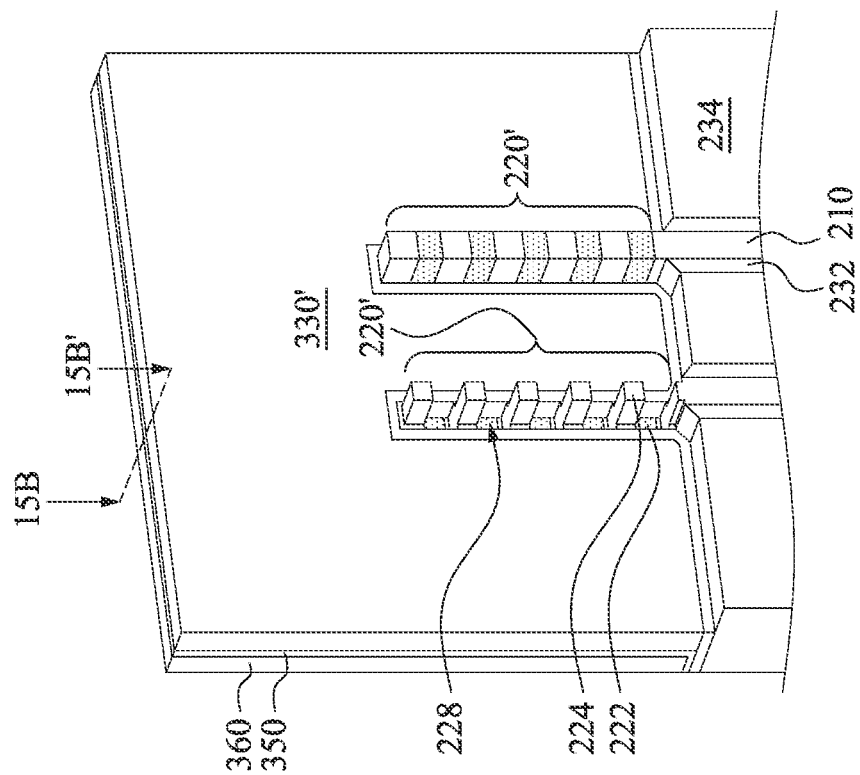

FIG. 15B is a cross-sectional view of the semiconductor device taken along a section line 15B-15B' of FIG. 15A in accordance with some embodiments of the present disclosure. In some embodiments, a length L1 of the opening 228 is greater than or equal to a distance D1 of the spacers 330'.

Figures 16A, 16B:
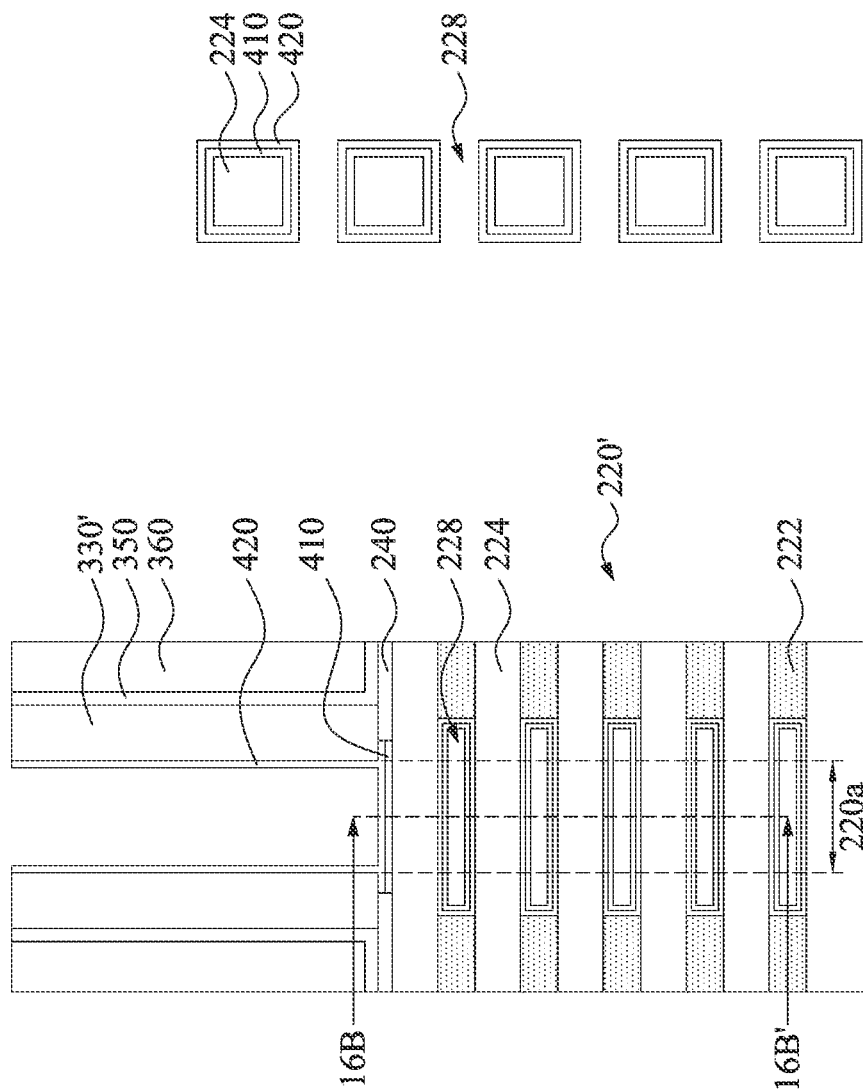
Figure 18B:
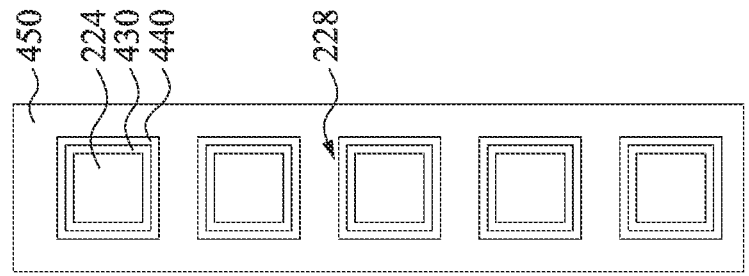
FIG. 18B is a cross-sectional view of the semiconductor device taken along a section line 18B-18B' of FIG. 18A in accordance with some embodiments of the present disclosure.
Figure 18A:
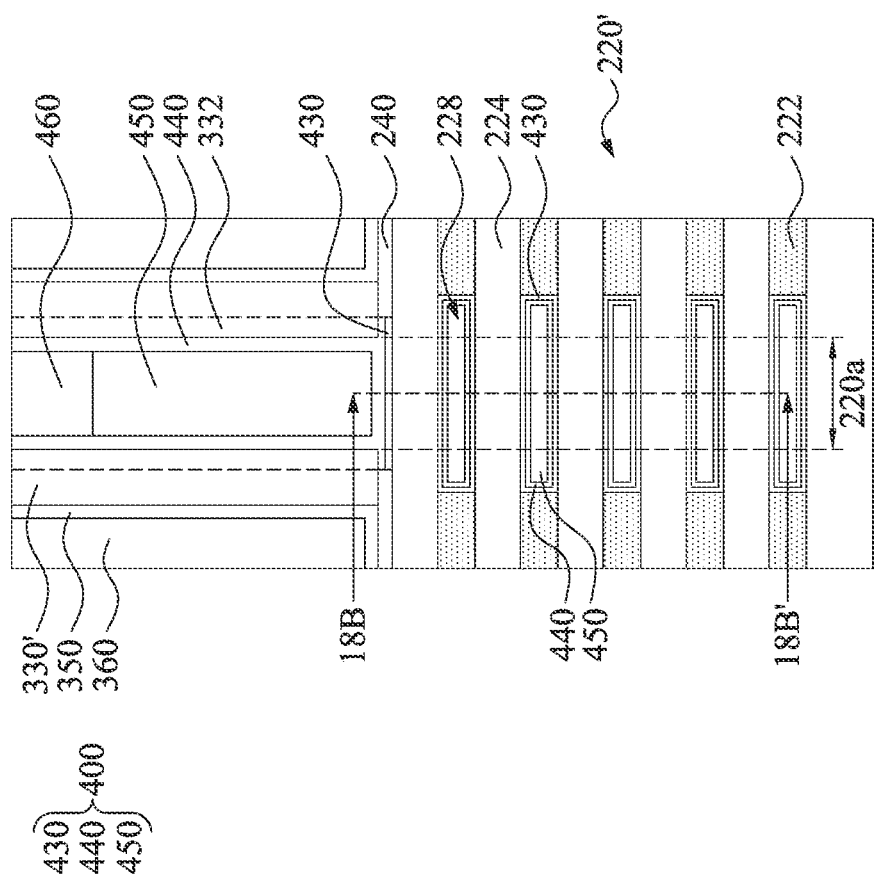

FIGS. 16A, 17A and 18A are cross-sectional views at various stages of manufacturing a semiconductor device subsequent to FIG. 15B in accordance with some embodiments of the present disclosure. FIG. 16B is a cross-sectional view of the semiconductor device taken along a section line 16B-16B' of FIG. 16A in accordance with some embodiments of the present disclosure. FIG. 17B is a cross-sectional view of the semiconductor device taken along a section line 17B-17B' of FIG. 17A in accordance with some embodiments of the present disclosure. FIG. 18B is a cross-sectional view of the semiconductor device taken along a section line 18B-18B' of FIG. 18A in accordance with some embodiments of the present disclosure.

As shown in FIGS. 15A, 15B, 16A and 16B, an interfacial layer 410 is formed covering the channel region 220a of the fin structure 220'. In some embodiments, the interfacial layer 410 is formed surrounding the second nanowires 224, as shown in FIG. 16B. In some embodiments, the interfacial layer 410 includes a dielectric material such as silicon oxide, germanium oxide, silicon oxynitride, germanium oxynitride and a combination thereof. In some embodiments, the interfacial layer 410 is formed by atomic layer deposition (ALD), chemical vapor deposition (CVD), thermal oxidation, wet oxidation, radical oxidation (RadOx) or combinations thereof. In some embodiments, the interfacial layer 410 includes chemical silicon oxide. In some embodiments, the chemical silicon oxide is formed by using a $H_2O_2$-containing solution, such as SC1 ($NH_4OH$, $H_2O_2$, and $H_2O$), SC2 (HCl, $H_2O_2$, and $H_2O$), SPM ($H_2SO_4$ and $H_2O_2$) or a combination thereof. In some embodiments, the interfacial layer 410 has a thickness in a range of 3 nm to 11 nm. In some embodiments, the interfacial layer 410 has a thickness in a range of 5 nm to 9 nm.

Still referring to FIGS. 15A, 15B, 16A and 16B, after the interfacial layer 410 is formed, a material layer 420 including a dopant is formed over the interfacial layer 410. The material layer 420 can also be called as a "dopant-rich layer". In some embodiments, as shown in FIGS. 15B and 16A, the material layer 420 is also formed over exposed side surfaces (not marked) of the spacer 330'. In some embodiments, the material layer 420 is formed surrounding the interfacial layer 410, as shown in FIG. 16B. In some embodiments, forming the material layer 420 including the dopant is conducted by performing an atomic layer deposition (ALD) process or other suitable processes. In some embodiments, the material layer 420 has a thickness in a range of 0.1 nm to 0.3 nm.

In some embodiments, the dopant in the material layer 420 is used to increase k-value of the interfacial layer 410. In some embodiments, the dopant included in the material layer 420 includes aluminum (Al), hafnium (Hf), lanthanum (La), scandium (Sc), yttrium (Y) or a combination thereof. In some embodiments, the precursor of yttrium (Y) used in the ALD process includes $Y(nBuCp)_3$, $Y(THD)_3$, $Y(EtCp)_3$, other suitable material or a combination thereof. In some embodiments, the precursor of lanthanum (La) used in the ALD process includes $La(iPr_2\text{-fmd})$, $La(THD)_3$, other suitable material or a combination thereof. In some embodiments, the precursor of scandium (Sc) used in the ALD process includes $Sc(THD)_3$, $Sc(Et_2\text{-amd})_3$, $La(tBu_2fmd)_3$, other suitable material or a combination thereof.

As shown in FIGS. 16A, 16B, 17A and 17B, an annealing process is performed on the material layer 420 to drive the dopant of the material layer 420 into the interfacial layer 410, thereby forming a doped interfacial layer 430 covering the channel region 220a of the fin structure 220'. In some embodiments, the doped interfacial layer 430 is formed surrounding the second nanowires 224, as shown in FIG. 17B. In some embodiments, the annealing process is performed at a temperature in a range of 200° C. to 900° C. In some embodiments, the annealing process is performed at a temperature in a range of 300° C. to 800° C. In some embodiments, the annealing process is performed for 3 seconds to 1 hour. In some embodiments, the annealing process is performed for 5 seconds to 30 minutes.

In some embodiments, the doped interfacial layer 430 includes a dopant selected from the group consisting of Al, Hf, La, Sc, Y and a combination thereof. In some embodiments, the doped interfacial layer 430 includes Al, Hf, La, Sc or Y-doped germanium oxide or a combination thereof. In some embodiments, the doped interfacial layer 430 includes Al, Hf, La, Sc or Y-doped silicon oxide or a combination thereof. In some embodiments, the doped interfacial layer 430 has a k-value more than 3.8 and less than 12. In some embodiments, the doped interfacial layer 430 has a k-value more than 3.9 and less than 10. In some embodiments, the doped interfacial layer 430 has a k-value more than or equal to 6. Since the doped interfacial layer 430 has high k-value, capacitance of gate dielectric formed in subsequent operation and $I_{on}$ of the semiconductor device are increased. In some embodiments, as shown in FIGS. 16A and 17A, the annealing process also drives the dopant of the material layer 420 over the side surfaces of the spacer 330' into the spacer 330' to form a dopant-containing region 332.

As shown in FIGS. 17A, 17B, 18A and 18B, a high-k dielectric layer 440 is formed over the doped interfacial layer 430. In some embodiments, the high-k dielectric layer 440 is formed surrounding the doped interfacial layer 430, as shown in FIG. 18B. In some embodiments, the high-k dielectric layer 440 may include $HfO_2$, $ZrO_2$, $Y_2O_3$, $La_2O_5$, $Gd_2O_5$, $TiO_2$, $Ta_2O_5$, HfSiO, HfSiON, HfErO, HfLaO, HfYO, HfGdO, HfAlO, HfZrO, HfTiO, HfTaO, SrTiO, any other suitable high-k dielectric material or a combination thereof. In some embodiments, the high-k dielectric layer 440 is formed by ALD, PVD, CVD, oxidation, and/or other suitable methods.

Referring to FIGS. 18A and 18B, after the high-k dielectric layer 440 is formed, a gate electrode 450 is formed over the high-k dielectric layer 440. In some embodiments, the gate electrode 450 includes Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable material or a combination thereof. In some embodiments, the gate electrode 450 is formed using ALD, PVD, CVD, e-beam evaporation, or other suitable process.

Still referring to FIGS. 18A and 18B, after the gate electrode 450 is formed, a protective layer 460 is formed over the gate electrode 450. The protective layer 460 is configured to protect the gate electrode 450 during subsequent processing steps. In some embodiments, the protective layer 460 is also called as self-aligned contact (SAC). In some embodiments, the protective layer 460 is made of an insulating material, such as silicon oxide, silicon nitride, silicon oxynitride, silicon carbon nitride, any other suitable dielectric material or a combination thereof. In some embodiments, the protective layer 460 is formed using deposition, such as PVD or CVD, other suitable processes or a combination thereof.

After the protective layer 460 is formed, a series of backend processes may be implemented. In some embodiments, the backend processes includes ILD (i.e., ILD layer 360 of FIG. 18A) remove process, dummy material filling/patterning processes, another ILD filling process, planarization process, dummy material and CESL (i.e., CESL 350 of FIG. 18A) remove process, contact barrier layer (e.g., Ti/TiN) deposition process, thermal anneal process (e.g., rapid thermal anneal (RTA)), contact material (e.g., cobalt) deposition process and planarization process.

Figure 19C:
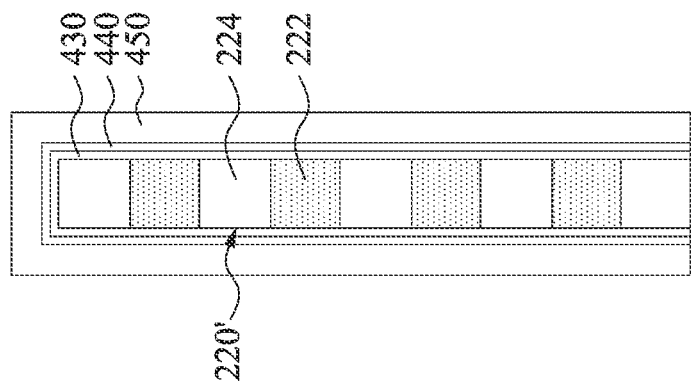
FIGS. 19A, 19B and 19C are cross-sectional view at various stages of manufacturing a semiconductor device subsequent to FIG. 14A in accordance with some embodiments of the present disclosure.
Figure 19B:
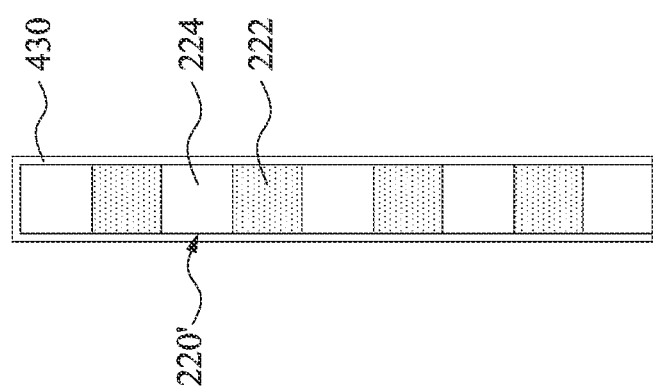
Figure 19A:
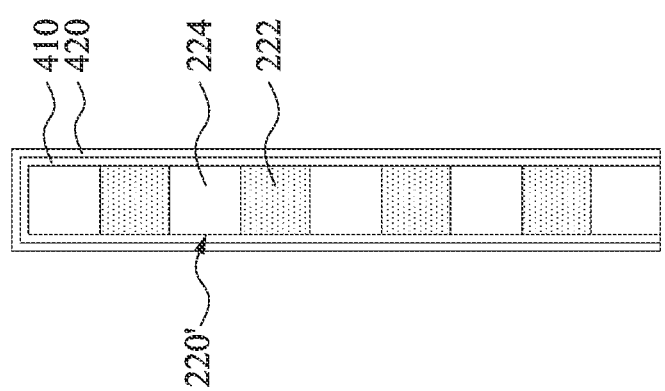

FIGS. 19A, 19B and 19C are cross-sectional view at various stages of manufacturing a semiconductor device subsequent to FIG. 14A in accordance with some embodiments of the present disclosure. As shown in FIGS. 14A and 19A, the first nanowires 222 in the channel region of the fin structure 220' are not removed. As shown in FIG. 19A, an interfacial layer 410 and a material layer 420 including a dopant are sequentially formed covering the channel region of the fin structure 220'. Embodiments of forming the interfacial layer 410 and the material layer 420 may be same as those embodiments described above association with FIGS. 16A and 16B.

As shown in FIGS. 19A and 19B, after the interfacial layer 410 and the material layer 420 including the dopant are sequentially formed, an annealing process is performed to form a doped interfacial layer 430 covering the channel region of the fin structure 220'. Embodiments of performing the annealing process to form the doped interfacial layer 430 are similar or same as those embodiments described above association with FIGS. 17A and 17B.

As shown in FIGS. 19B and 19C, after the annealing process is performed to form the doped interfacial layer 430, a high-k dielectric layer 440 and a gate electrode 450 are sequentially formed covering the doped interfacial layer 430. Embodiments of forming the high-k dielectric layer 440 and the gate electrode 450 are similar or same as those embodiments described above association with FIGS. 18A and 18B.

The present disclosure further provides a semiconductor device including a doped interfacial layer with high k-value. As shown in FIG. 18A, the semiconductor device includes a fin structure 220' and a gate structure 400 across over the fin structure 220'. The gate structure 400 includes a doped interfacial layer 430, a high-k dielectric layer 440 and a gate electrode 450.

As shown in FIG. 18A, the doped interfacial layer 430 covers a portion of the fin structure 220'. In some embodiments, the doped interfacial layer 430 includes a dopant selected from the group consisting of Al, Hf, La, Sc, Y and a combination thereof. In some embodiments, the doped interfacial layer 430 includes a dielectric material selected from the group consisting of silicon oxide, germanium oxide, silicon oxynitride, germanium oxynitride and a combination thereof. In some embodiments, the doped interfacial layer 430 includes Al, Hf, La, Sc or Y-doped germanium oxide or a combination thereof. In some embodiments, the doped interfacial layer 430 includes Al, Hf, La, Sc or Y-doped silicon oxide or a combination thereof. In some embodiments, the doped interfacial layer 430 has a k-value more than 3.8 and less than 12. In some embodiments, the doped interfacial layer 430 has a k-value more than 3.9 and less than 10. In some embodiments, the doped interfacial layer 430 has a k-value more than or equal to 6. Since the doped interfacial layer 430 has high k-value, capacitance of gate dielectric and $I_{on}$ of the semiconductor device are increased.

In some embodiments, the portion of the fin structure 220' includes second nanowires 224 substantially parallel and separated from each other, and the doped interfacial layer 430 surrounds the second nanowires 224, as shown in FIG. 18B. In some embodiments, the portion of the fin structure 220' includes first nanowires 222 and second nanowires 224 alternately disposed with the first nanowires 222, as shown in FIG. 19C.

The high-k dielectric layer 440 is over the doped interfacial layer 430. In some embodiments, the high-k dielectric layer 440 surrounds the doped interfacial layer 430, as shown in FIG. 18B. In some embodiments, the high-k dielectric layer 440 may include $HfO_2$, $ZrO_2$, $Y_2O_3$, $La_2O_5$, $Gd_2O_5$, $TiO_2$, $Ta_2O_5$, HfSiO, HfSiON, HfErO, HfLaO, HfYO, HfGdO, HfAlO, HfZrO, HfTiO, HfTaO, SrTiO, any other suitable high-k dielectric material or a combination thereof.

The gate electrode 450 is over the high-k dielectric layer 440. In some embodiments, the gate electrode 450 surrounds the high-k dielectric layer 440, as shown in FIG. 18B. In some embodiments, the gate electrode 450 includes Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable material or a combination thereof.

In some embodiments, as shown in FIG. 18A, the semiconductor device further includes a spacer 330' adjacent to both sides of the gate electrode 450, in which the spacer 330' includes the dopant. In some embodiments, the dopant in the spacer 330' is same as the dopant in the doped interfacial layer 430.

According to some embodiments, a method of manufacturing a semiconductor device includes: receiving a semiconductor structure, the semiconductor structure including: a fin structure; a dummy gate across over the fin structure to define a channel region of the fin structure; and a dummy dielectric layer separating the channel region of the fin structure from the dummy gate; removing the dummy gate and the dummy dielectric layer to expose the channel region of the fin structure; and forming a doped interfacial layer covering the channel region of the fin structure, in which the doped interfacial layer includes a dopant selected from the group consisting of Al, Hf, La, Sc, Y and a combination thereof.

According to some embodiments, a semiconductor device includes: a fin structure; and agate structure across over the fin structure, in which the gate structure includes: a doped interfacial layer covering a portion of the fin structure, in which the doped interfacial layer includes a dopant selected from the group consisting of Al, Hf, La, Sc, Y and a combination thereof; a high-k dielectric layer over the doped interfacial layer; and a gate electrode over the high-k dielectric layer.

According to some embodiments, a semiconductor device includes: a fin structure; and a gate structure across over the fin structure, in which the gate structure includes: a doped interfacial layer covering a portion of the fin structure, in which the doped interfacial layer has a k-value more than 3.9 and less than 10; a high-k dielectric layer over the doped interfacial layer; and a gate electrode over the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dummy gate dielectric layer over a channel region of a fin structure;
   forming a dummy gate over the dummy gate dielectric layer;
   removing the dummy gate and a first portion of the dummy gate dielectric layer to expose the channel region of the fin structure;
   removing a first nanowire of the fin structure above a second nanowire of the fin structure to remain the second nanowire of the fin structure;
   forming an interfacial layer surrounding the second nanowire;
   forming a material layer comprising dopants over the interfacial layer; and
   performing an annealing process to drive the dopants of the material layer into the interfacial layer, thereby forming a doped interfacial layer surrounding the second nanowire.

2. The method of claim 1, further comprising:
   forming a high-k dielectric layer surrounding the doped interfacial layer.

3. The method of claim 1, further comprising:
   forming a gate electrode surrounding the doped interfacial layer.

4. The method of claim 1, wherein a thickness of the material layer is in a range of 0.1 nm to 0.3 nm.

5. The method of claim 1, wherein dopants of the material layer comprise aluminum (Al), hafnium (Hf), lanthanum (La), scandium (Sc), yttrium (Y) or combinations thereof.

6. The method of claim 1, wherein the interfacial layer is formed to be in contact with a second portion of the dummy gate dielectric layer.

7. The method of claim 6, wherein a thickness of the second portion of the dummy gate dielectric layer is greater than a thickness of the doped interfacial layer.

8. A method comprising:
   forming a fin structure over a substrate;
   forming a dummy gate crossing the fin structure;
   forming gate spacers on opposite sides of the dummy gate;
   removing the dummy gate to form an opening between the gate spacers and expose a top surface of the fin structure;
   depositing an interfacial layer to cover the top surface of the fin structure;
   depositing a material layer over the interfacial layer and in contact with sidewalls of the gate spacers, wherein the material layer comprises dopants;
   performing an anneal process to drive the dopants of the material layer into the gate spacers; and
   after performing the anneal process, forming a gate structure in the opening.

9. The method of claim 8, wherein portions of the material layer are deposited under the gate spacers.

10. The method of claim 8, wherein each of the gate spacers comprises a first portion and a second portion between the first portion and the gate structure, and a dopant concentration of the second portion of each of the gate spacers is higher than a dopant concentration of the first portion of each of the gate spacers after performing the anneal process.

11. The method of claim 10, wherein the gate structure is in contact with the second portion of each of the gate spacers.

12. The method of claim 8, wherein forming the fin structure comprising:
    forming a first epitaxial layer of a first composition over the substrate;
    forming a second epitaxial layer of a second composition over the first epitaxial layer; and
    patterning the first epitaxial layer and the second epitaxial layer to form the fin structure.

13. The method of claim 12, further comprising removing a portion of the first epitaxial layer to suspend the second epitaxial layer over the substrate prior to depositing the interfacial layer.

14. The method of claim 12, wherein the material layer is separated from the first epitaxial layer by the interfacial layer.

15. A method comprising:
    forming a dummy gate dielectric layer over a channel region of a fin structure;
    forming a dummy gate over the dummy gate dielectric layer;
    forming gate spacers on opposite sides of the dummy gate;
    removing the dummy gate and a first portion of the dummy gate dielectric layer to form an opening between the gate spacers, wherein the opening exposes inner sidewalls of the gate spacers;
    forming an interfacial layer in the opening to cover the channel region of the fin structure and be spaced apart from the inner sidewalls of the gate spacers;
    performing a doping process to dope the interfacial layer and the inner sidewalls of the gate spacers simultaneously; and
    after performing the doping process, forming a gate structure in the opening.

16. The method of claim 15, wherein the gate structure is formed to be in contact with the inner sidewalls of the gate spacers and separated from the channel region of the fin structure by the interfacial layer.

17. The method of claim 15, wherein performing the doping process comprises doping Al, Hf, La, Sc, Y, or combinations thereof into the interfacial layer and the inner sidewalls of the gate spacers.

18. The method of claim 15, wherein after performing the doping process, the interfacial layer is spaced apart from the gate spacers.

19. The method of claim 15, wherein forming the gate structure comprises:
   depositing a high-k dielectric layer in the opening, in contact with the inner sidewalls of the gate spacers, and covering the interfacial layer; and
   depositing a gate electrode in the opening and over the high-k dielectric layer.

20. The method of claim 19, wherein the high-k dielectric layer is in contact with a second portion of the dummy gate dielectric layer.

* * * * *